(12) United States Patent
Srinivasan et al.

(10) Patent No.: US 10,495,690 B2
(45) Date of Patent: Dec. 3, 2019

(54) COMBINATORIAL SERIAL AND PARALLEL TEST ACCESS PORT SELECTION IN A JTAG INTERFACE

(71) Applicant: STMicroelectronics International N.V., Schiphol (NL)

(72) Inventors: Venkata Narayanan Srinivasan, Gautam Budh Nagar District (IN); Manish Sharma, Gurgaon (IN)

(73) Assignee: STMicroelectronics International N.V., Schiphol (NL)

( * ) Notice: Subject to any disclaimer, the term of this patent is extended or adjusted under 35 U.S.C. 154(b) by 23 days.

(21) Appl. No.: 15/688,184

(22) Filed: Aug. 28, 2017

(65) Prior Publication Data

US 2019/0064270 A1   Feb. 28, 2019

(51) Int. Cl.
| | |
|---|---|
| *G01R 31/3185* | (2006.01) |
| *G06F 11/267* | (2006.01) |
| *G06F 11/27* | (2006.01) |
| *G01R 31/3183* | (2006.01) |
| *G01R 31/317* | (2006.01) |

(52) U.S. Cl.
CPC ........ *G01R 31/318533* (2013.01); *G01R 31/31705* (2013.01); *G01R 31/318307* (2013.01); *G01R 31/318519* (2013.01); *G01R 31/318555* (2013.01); *G01R 31/318563* (2013.01); *G06F 11/267* (2013.01); *G06F 11/27* (2013.01); *G01R 31/318558* (2013.01)

(58) Field of Classification Search
CPC ...... G01R 31/318533; G01R 31/31705; G01R 31/318563; G01R 31/318555; G01R 31/318307; G01R 31/318519; G01R 31/318558; G06F 11/27; G06F 11/267
USPC .......................................................... 714/727
See application file for complete search history.

(56) References Cited

U.S. PATENT DOCUMENTS

| | | | | |
|---|---|---|---|---|
| 5,935,266 A * | 8/1999 | Thurnhofer | ...... | G01R 31/31705 714/30 |
| 6,122,762 A * | 9/2000 | Kim | ........ | G11C 29/32 714/726 |
| 7,665,002 B1 * | 2/2010 | White | ........ | G01R 31/31705 714/727 |
| 8,219,863 B2 * | 7/2012 | Swoboda | ....... | G01R 31/318544 714/30 |
| 2002/0078420 A1 * | 6/2002 | Roth | ........ | G01R 31/318572 714/798 |
| 2006/0156099 A1 * | 7/2006 | Sweet | ........ | G01R 31/31705 714/724 |

(Continued)

*Primary Examiner* — James C Kerveros
(74) *Attorney, Agent, or Firm* — Crowe & Dunlevy (57) ABSTRACT

A circuit is for coupling test access port (TAP) signals to a Joint Test Action Group (JTAG) interface in an integrated circuit package. An nTRST pin receives a test reset signal, a TMS pin receives a test mode select signal, a testing test access port (TAP) has a test reset signal input and a test mode select signal input, and a debugging test access port (TAP) has a test reset signal input coupled to the nTRST pin and a test mode select signal input coupled to the TMS pin. An inverter has an input coupled to the nTRST pin and an output coupled to the test reset signal input of the testing TAP, and an AND gate has a first input coupled to the output of the inverter, a second input coupled to the TMS pin, and an output coupled to the test mode select input of the testing TAP.

10 Claims, 5 Drawing Sheets

(56) References Cited

U.S. PATENT DOCUMENTS

2014/0101500 A1\* 4/2014 Bastimane ..... G01R 31/318536
  714/727
2018/0059184 A1\* 3/2018 Deng ............... G01R 31/31705

\* cited by examiner

COMBINATORIAL SERIAL AND PARALLEL TEST ACCESS PORT SELECTION IN A JTAG INTERFACE

TECHNICAL FIELD

This disclosure is related to the field of the Joint Test Action Group (JTAG) testing or interfaces, as per the IEEE 1149.1 standard, and, in particular, to device specific functionality that complies with this standard yet reduces the number of pins used and that reduces latency.

BACKGROUND

JTAG is the name used for the IEEE 1149.1 standard entitled Standard Test Access Port and Boundary-Scan Architecture for test access ports (TAP) used for testing printed circuit boards (PCB) and microprocessors. The acronym JTAG stands for the Joint Test Action Group, the name of the organization of individuals that developed the IEEE 1149.1 standard.

The functionality offered by JTAG is that of providing debug access and boundary scan testing to and of PCBs and microprocessors. Debug Access is used by debugger tools to access the internals of a chip, thereby making its resources and functionality available and modifiable, e.g. registers, memories and the system state. Thus, debug access may be used to test the functioning of the chip itself. Boundary Scan testing is used by hardware test tools to test the physical connection of a chip to other devices on a printed circuit board (PCB). Thus, boundary scan testing may be used to test for proper electrical connections between the chip and other devices.

The debug function may in some cases utilize one TAP, while the boundary scan function utilizes another TAP. However, this may necessitate the use of an extra pin to select between them, which is above the minimum required by the JTAG standard, which may be undesirable in some scenarios.

In some instances, both the boundary scan function TAP and the debug function TAP can be connected in series. However, this may result in increased latency during boundary scan testing, which may be undesirable.

Therefore, further development in hardware implementing JTAG interfaces is needed.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

Disclosed herein is a circuit for coupling test access port (TAP) signals to a Joint Test Action Group (JTAG) interface in an integrated circuit package. The circuit includes an nTRST pin configured to receive a test reset signal, a TMS pin configured to receive a test mode select signal, a testing test access port (TAP) having a test reset signal input and a test mode select signal input, and a debugging test access port (TAP) having a test reset signal input coupled to the nTRST pin and a test mode select signal input coupled to the TMS pin. The circuit also includes an inverter having an input coupled to the nTRST pin and an output coupled to the test reset signal input of the testing TAP, and an AND gate having a first input coupled to the output of the inverter, a second input coupled to the TMS pin, and an output coupled to the test mode select input of the testing TAP.

The testing TAP is selected and the debugging TAP is placed in a reset mode when the test reset signal is asserted (active low, so asserted is a logic zero) and the testing TAP operations are controlled from the test mode select signal.

The debugging TAP is selected and the testing TAP is placed in a reset mode when the test reset signal is deasserted (active low, so deasserted is a logic one) and the debugging TAP operations are controlled from the test mode select signal.

The circuit would otherwise include a TAPSEL pin to receive a TAP selection signal, but instead has its total pin count reduced by one by not including the TAPSEL pin.

The circuit would otherwise include a TAPSEL pin to receive a TAP selection signal, but instead has a general purpose input output pin.

The JTAG interface may be an interface compliant with IEEE Standard 1149.1-2013, entitled Standard Test Access Port and Boundary-Scan Architecture.

Also disclosed herein is a circuit for coupling test access port (TAP) signals to a Joint Test Action Group (JTAG) interface in an integrated circuit package. The circuit includes a test data in (TDI) pin configured to receive a test data input signal, a test data out (TDO) pin configured to output a test data output signal, and debugging test access port (TAP) circuitry having a test data input coupled to the TDI pin, and a bypass register having an input coupled to the test data input of the debugging TAP circuitry. Multiplexing circuitry has a first input coupled to the TDI pin, a second input coupled to receive output from the debugging TAP circuitry, and an output. Testing test access port (TAP) circuitry has a test data input coupled to the output of the multiplexing circuitry, and a data register having an input coupled to the test data input of the testing TAP circuitry. The debugging TAP circuitry further includes an instruction register. The testing TAP circuitry includes an instruction register. Glue logic is configured to control switching of the multiplexing circuitry such that the test data input signal is coupled to the input of the data register of the testing TAP circuitry when the debugging TAP circuitry and the testing TAP circuitry are both in a shift data register (shift-dr) state and the instruction register of the debugging TAP circuitry contain a bypass instruction, or when the instruction registers of both the debugging TAP circuitry and the testing TAP circuitry contain device ID code (IDCODE) instructions, such that the output of the debugging TAP circuitry is coupled to the input of the data register of the testing TAP circuitry when the debugging TAP circuitry and the testing TAP circuitry are not both in the shift-dr state or in a shift-dr state and the debugging TAP circuitry does not contain a bypass instruction, or debugging TAP circuitry and the testing TAP circuitry does not contain device ID code (IDCODE) instructions.

The glue logic is configured to control switching of the multiplexing circuitry such that the output of the debugging TAP circuitry is coupled to the input of the instruction register of the testing TAP when the debugging TAP circuitry and the testing TAP circuitry are both in a shift instruction register (shift-ir) state.

Method aspects of the above are contemplated and included within the scope of this application.

DETAILED DESCRIPTION

One or more embodiments of the present disclosure will be described below. These described embodiments are only examples of the presently disclosed techniques. Additionally, in an effort to provide a concise description, some features of an actual implementation may not be described in the specification. When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements.

JTAG is a hardware interface that provides a way for a debug tool to communicate directly with a system on a chip, a core of a system on a chip, a microprocessor, or a core of a microprocessor on a printed circuit board (PCB). As explained, JTAG is codified as IEEE 1149.1, the contents of which are hereby incorporated by reference in their entirety.

Figure 1:
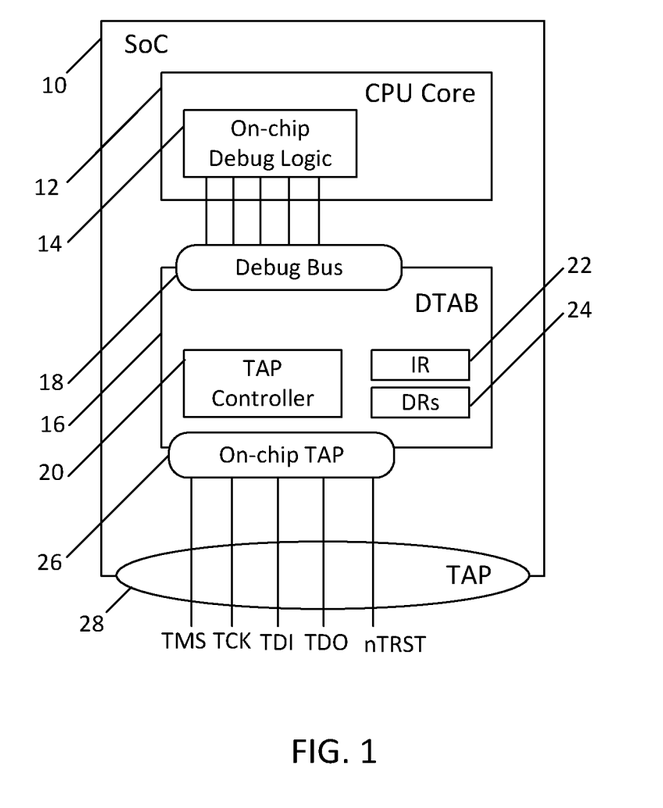
FIG. 1 is a schematic block diagram of a generic JTAG TAP.

Shown in FIG. 1 is a system on a chip (SoC) 10 including a debug and test access block (DTAB) 16 implementing generic JTAG functionality. The SoC 10 includes a central processing unit core 12, which itself has integrated therein on-chip debugging logic 14. The on-chip debugging logic 14 communicates with the DTAB 16 via a debug bus 18 associated with the DTAB 16. The DTAB 16 includes a TAP controller 20, such as a state machine, that interacts with an instruction register (IR) 22 and data registers (DRs) 24. The DTAB 16 provides an on-chip TAP 26 that is ultimately connected to the TAP 28 for the SoC 10.

As per IEEE 1149.1, the TAP 28 has five pins, each configured to receive or provide a specific signal. The pins and their associated signals are:

1. TCK, which receives the test clock signal. The TCK signal is the clock of, and dictates the speed of operation of, the TAP 20 controller. On every assertion of the test clock signal TCK, the TAP controller 20 takes a single action. The actual clock speed is not specified in the IEEE 1149.1 standard, but rather the TAP controller 20 is clocked according to the received test signal clock TCK.
2. TMS, which receives the test mode select signal. The TMS signal controls the specific actions taken by the TAP controller 20.
3. TDI, which receives the test data-in signal that feeds data to the SoC 10. The IEEE 1149.1 standard does not define protocols for communication over this pin. Those specifics are application dependent and may be defined by device manufacturers.
4. TDO, which receives the test data-out signal that provides output from the SoC 10. Like the TDI signal, the IEEE 1149.1 standard does not define protocols for communications over the TDO pin. Likewise, those specifics are application dependent and may be defined by device manufacturers.
5. nTRST, which receives the test reset signal. The nTRST signal is used to reset the JTAG to a known good state. This nTRST pin is optional as per the IEEE 1149.1 standard, and device manufacturers may decide whether or not to include it.

The TMS and TDI signals are sampled by the DTAB 16 on each rising edge of the TCK signal. The TDO signal outputs its value at each falling edge of TCK signal.

The functionality of the DTAB 16 is accessible via different instructions loaded into the IR 22. By loading an instruction into the IR 22, the corresponding DR 24 is selected for access, to thereby provide and/or accept data according to the selected instruction.

Certain instructions are defined by the IEEE 1149.1 standard. These instructions include the BYPASS instruction for use in daisy-chained configurations where TAPs of more than one chip or core connected in series, and the IDCODE instruction for identifying a specific device.

The TAP controller 20 is a state machine defined by the IEEE 1149.1 standard. Each state of the TAP controller 20 can be reached by a sequence of bits transmitted via the TMS signal, and is dependent on the current state.

The following states of the TAP controller are of interest:
1. Test Logic Reset sets the IR 22 to its reset value (IDCODE or BYPASS). This state can be reached from any other state by shifting five times a logic "1" value on TMS.
2. Run-Test/Idle and Select DR-Scan are used by debuggers as a pause parking position.
3. In the Shift-IR state, the debug tool shifts an instruction into the IR 22. The instruction is activated once the TAP controller 20 reaches the Update-IR state.
4. In the Shift-DR state, the debug tool shifts data to/from the DR 24 selected by the currently loaded instruction.

As explained, in some designs, separate TAPs may be used for boundary scan test and for debug. One such design is now described with respect to FIG. 2. Here, the test TAP 52 and debug TAP 54 access circuitry 66 under test comprising, for example, a core of a system on a chip, a microprocessor, or core of a microprocessor in parallel. Since the boundary scan test and debug mode may not be performed simultaneously, the associated logic circuitry 50 selects which of the test TAP 52 and debug TAP 54 to couple to the core of the system on a chip, the microprocessor, or core of the microprocessor.

Figure 2:
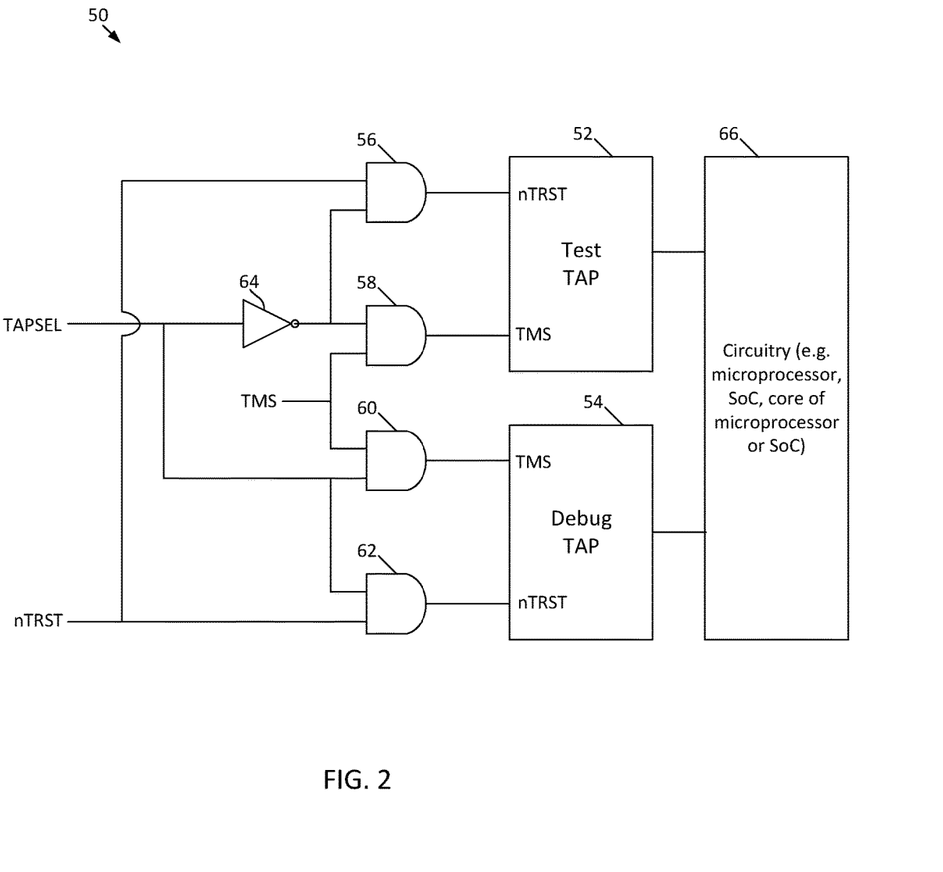
FIG. 2 is a schematic block diagram of a circuit permitting selection between a test (boundary scan) TAP and a debug TAP in parallel, utilizing an additional tap select pin and an associated signal.

In greater detail, the test TAP 52 has, among its other terminals, a nTRST terminal and a TMS terminal. AND gate 56 has its output coupled to the nTRST terminal of the test TAP 52, and receives as input the nTRST signal from the chip nTRST pin, and an inverted version of a tap select signal TAPSEL received from inverter 64. The AND gate 58 has its output coupled to the TMS terminal of the test TAP 52, and receives as input the inverted version of TAPSEL from the inverter 64 and the TMS signal, from the chip TMS pin.

The debug TAP 54 has, among its other terminals, an nTRST terminal and a TMS terminal. The AND gate 60 has its output coupled to the TMS terminal of the debug TAP 54, and receives as input the TMS signal and the TAPSEL signal from the chip TAPSEL pin. The AND gate 62 has its output coupled to the nTRST terminal of the debug TAP 54, and receives as input the nTRST signal from the chip nTRST pin, and the TAPSEL signal from the chip TAPSEL pin.

In operation, when TAPSEL is asserted (for example, logic high), the debug TAP 54 is selected and the test TAP 52 is deselected. Likewise, when TAPSEL is deasserted (for example, logic low), the test TAP 52 is selected and the debug TAP 54 is deselected.

As can be readily appreciated, while this circuitry 50 permits for the test TAP 52 and debug TAP 54 to be coupled in parallel to the circuitry 66 (e.g., the core of the system on a chip, the microprocessor, or core of the microprocessor), the TAPSEL pin of the chip is utilized. This represents the adding of an additional pin to a package, which may be undesirable, since such a pin could either be eliminated in application packaging using fewer pins, or could instead be repurposed as a general purpose input/output pin in application packaging supporting more pins.

Therefore, the Inventors have devised new circuitry to implement the same parallel functionality, as shown in FIG. 2, but without the use of a TAPSEL pin. This approach is usable in implementations where the optional nTRST signal is present.

Figure 3:
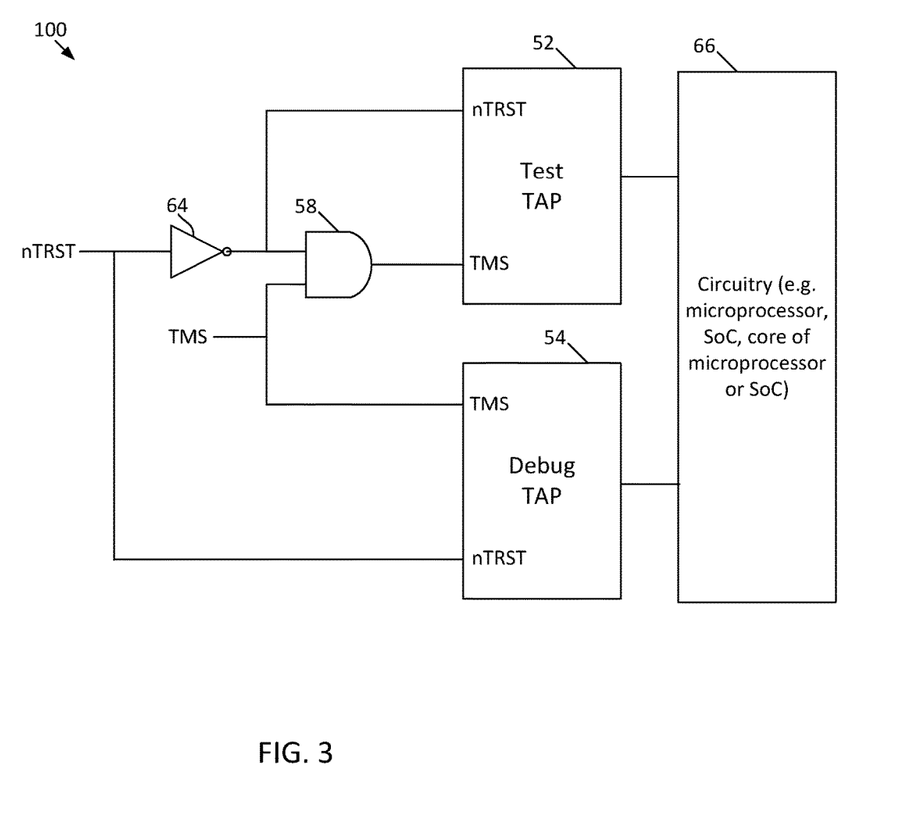
FIG. 3 is a schematic block diagram of a circuit permitting selection between a test (boundary scan) TAP and a debug TAP in parallel, utilizing a test reset pin and associated signal nTRST in selection instead of using an additional tap select pin, in accordance with this disclosure.

With reference to FIG. 3, this design is now described. Here, the circuit 100 includes the test TAP 52 and the debug TAP 54. The AND gate 58 has its output coupled to the TMS terminal of the test TAP 52, and receives as input the TMS signal from the TMS pin of the chip, as well as an inverted version of the nTRST signal from inverter 64 whose input receives the nTRST signal from the chip nTRST pin. The nTRST terminal of the test TAP 52 is also coupled to receive the inverted version of the nTRST signal. The TMS terminal of the debug TAP 54 is coupled to receive the TMS signal from the chip TMS pin, and the nTRST terminal of the debug TAP 54 is coupled to receive the nTRST signal from the chip nTRST pin.

In operation, when nTRST is asserted (for example, logic low), the test TAP 52 is selected and the debug TAP 54 is deselected. Likewise, when nTRST is deasserted (for example, logic high), the debug TAP 54 is selected and the test TAP 52 is deselected.

This circuit 100 provides for a way to select between the test TAP 52 and debug TAP 54, without the addition of a TAPSEL pin and TAPSEL signal, in devices where the nTRST pin is to be used. The pin that would otherwise have been the TAPSEL pin can either then be eliminated, or used as a general purpose input/output pin.

Figure 4:
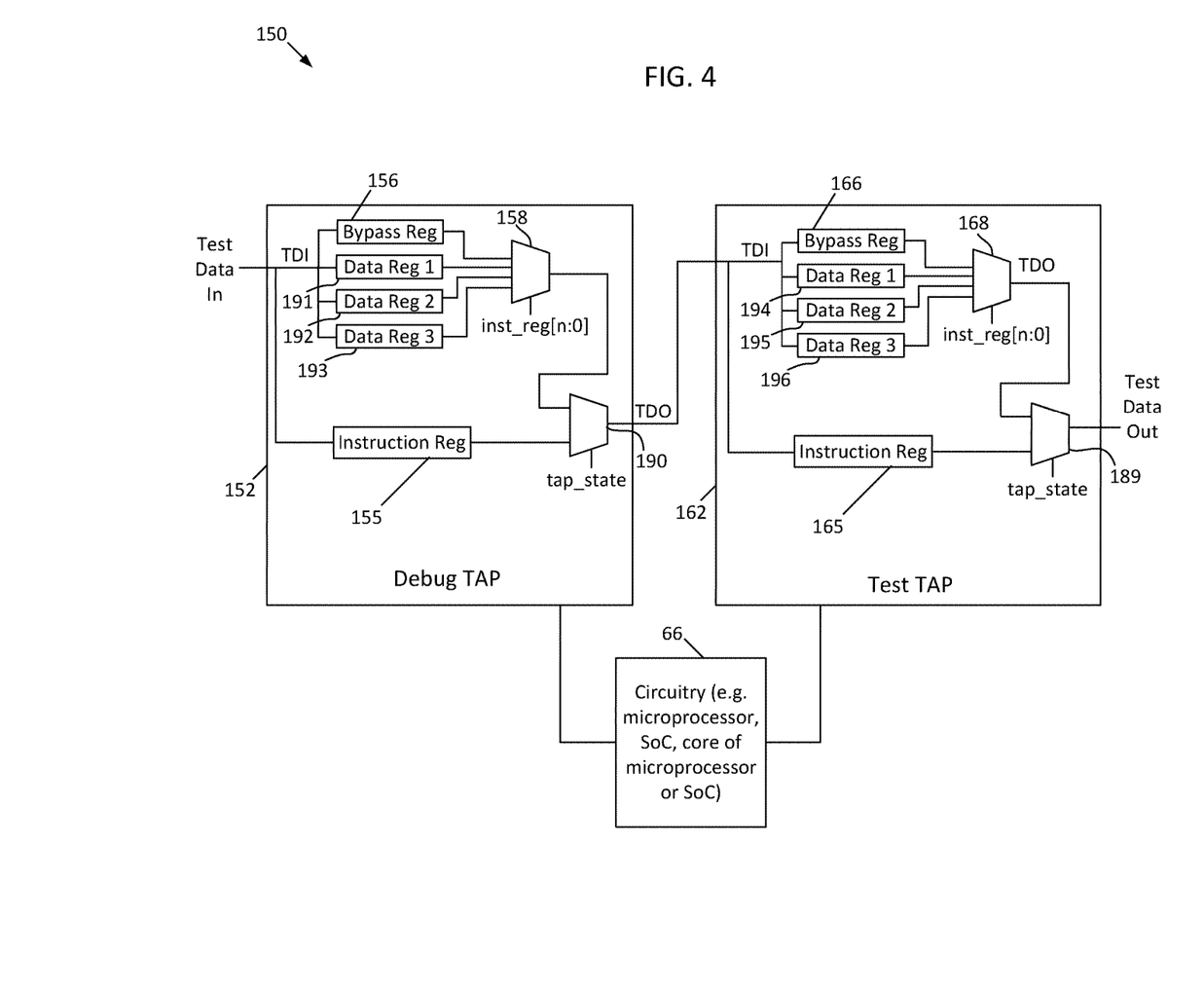
FIG. 4 is a schematic block diagram of a circuit permitting selection between a debug TAP and a test (boundary scan) TAP in series in a fashion that introduces latency during boundary scan testing.

As now described with reference to FIG. 4, in some designs, the debug TAP 152 and test TAP 162 access a core of a system on a chip, a microprocessor, or core of a microprocessor in series. The debug TAP 152 includes a bypass register 156, data registers 191-193, and an instruction register 155. The bypass register 156, and data registers 191-193 receive the TDI signal, and provide output to the multiplexer 158, which itself is controlled as a function of the inst_reg[n:o] signal, which indicates the register selected by the instruction in the instruction register 155. The output of multiplexer 158 is fed to the input of multiplexer 190, which also receives input from the instruction register 155. The multiplexer 190 is controlled as a function of the tap_state signal.

The output TDO of the debug tap 152 is fed to the input TDI of test TAP 162. The test TAP 162 includes a bypass register 166, data registers 194-196, and an instruction register 165. The bypass register 166, and data registers 194-196 receive the TDI signal (TDO from the debug TAP 152), and provide output to the multiplexer 168, which itself is controlled as a function of its inst_reg[n:o] signal, which indicates the register selected by the instruction in the instruction register 165. The output of multiplexer 168 is fed to the input of multiplexer 189, which also receives input from the instruction register 165. The multiplexer 189 is controlled as a function of the tap_state signal. TDO for the circuit 150 is provided at the output of multiplexer 189.

Here, if the test TAP 162 is to be selected, during a shift-IR operation, the instruction register 155 of the debug TAP 152 is loaded with a bypass instruction, and the instruction register 165 of the test TAP 162 is loaded with a test instruction. During a shift-DR operation, the inst_reg [n:0] signal causes the multiplexer 158 to select the bypass register 156, and the tap_state signal causes the multiplexer 190 to select the output of the multiplexer 158.

During the shift-DR operation, one of the data registers 194-196 of the test TAP 162 is selected by the multiplexer 168 as a function of the inst_reg[n:0] signal, and the output of multiplexer 168 is selected by multiplexer 189 as a function of the tap_state signal.

Therefore, the output of the bypass register 156 is connected one of the data registers 194-196 the test TAP 162 through multiplexers 158 and 190. The output of one of these data registers 194-196 is coupled to the TDO terminal of the test TAP 162 through multiplexers 168 and 189.

As can be readily appreciated, while this circuitry 150 permits for the debug TAP 152 and test TAP 162 to be coupled in series to the core of the system on a chip, the microprocessor, or core of the microprocessor, when the test TAP 162 is to be selected, latency is introduced through the necessity of first shifting the TDI signal through the bypass register 156 of the debug TAP 152. This latency may be undesirable.

Figure 5:
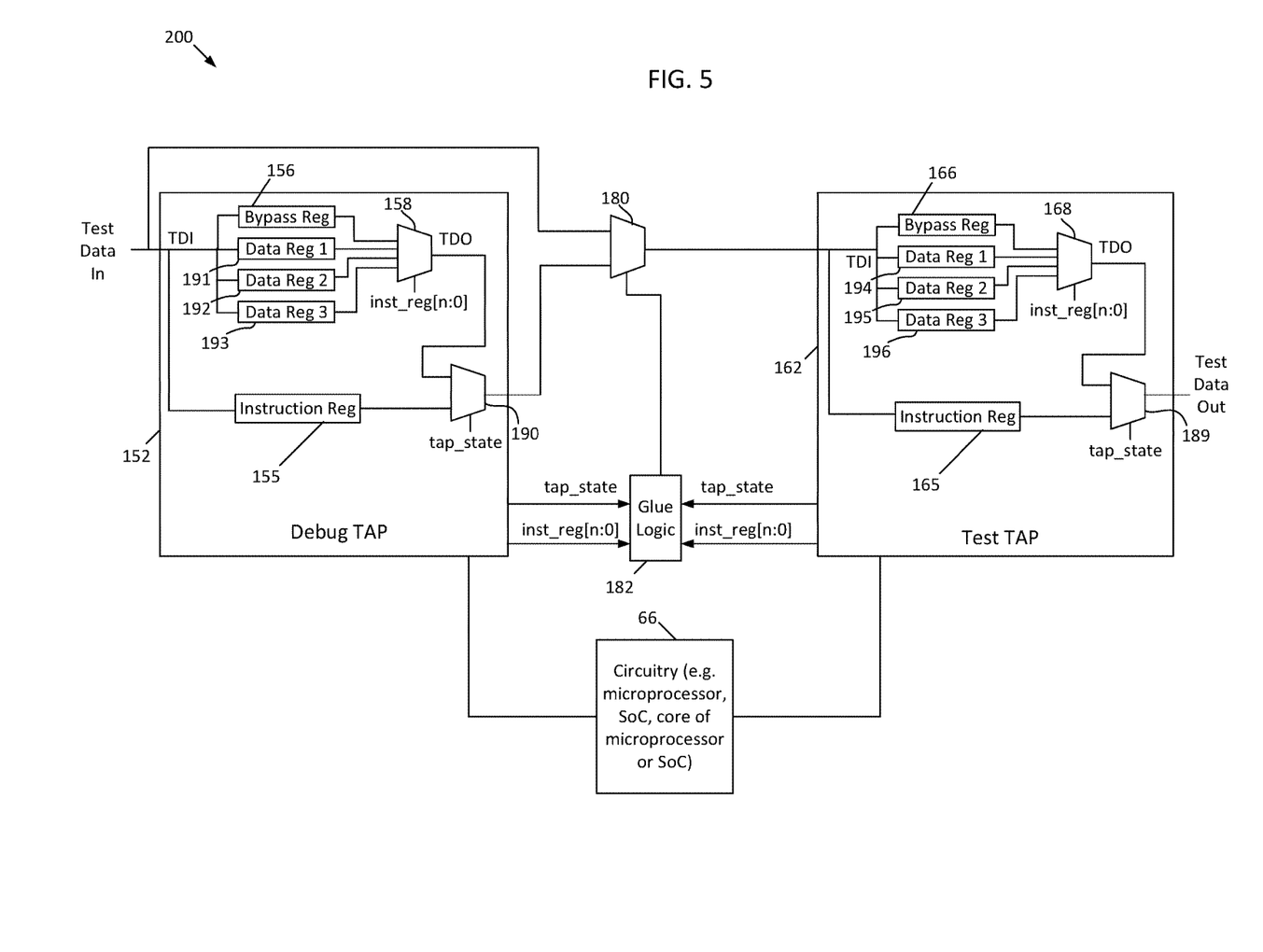
FIG. 5 is a schematic block diagram of a circuit permitting selection between a debug TAP and a test (boundary scan) TAP in series in a fashion that eliminates latency during boundary scan testing, in accordance with this disclosure.

Therefore, the Inventors have devised new circuitry to implement the same serial functionality, but without the latency. With reference to FIG. 5, this design is now described. Here, glue logic 182 receives the tap_state and inst_reg[n:0] signals from the debug TAP 152 and test TAP 162. A multiplexer 180 is coupled to receive as input both the TDI to the debug TAP 152, as well as the TDO from the debug TAP 152. The multiplexer 180 is controlled by the glue logic 182.

Here, if the test TAP 162 is to be selected, during a shift-IR operation, the instruction register 155 of the debug TAP 152 is loaded with a bypass instruction and the instruction register 165 of the test TAP 162 is loaded with a test instruction to select a desired data register 194-196. During a shift-DR operation, and when the instruction register 155 is loaded with the bypass instruction, the Glue Logic 182 will control multiplexer 180 such that it passes the TDI signal directly to the TDI terminal of the test TAP 162, bypassing the debug TAP 152. Otherwise, the Glue Logic 182 controls multiplexer 180 such that the TDO output of debug TAP 152 is coupled to the TDI input of test TAP 162.

This reduces latency, and thus reduces test time. This is desirable in some instances.

In greater detail, in boolean logic, the glue logic 182 selects the TDI signal of debug TAP 152 when ((debug_tap.tap_state=shift_dr & debug_tap.instr_reg(n:0)=bypass instruction code & test_tap.tap_state=shift_dr) (debug_tap.tap_state= shift_dr & debug_tap.instr_reg(n:0)=debug idcode instruction & test_tap.tap_state=shift_dr & test_tap.instr_ reg(n:0)=device idcode instruction)). Otherwise, the glue logic 182 selects the TDO output of debug TAP 152.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A circuit for coupling test access port (TAP) signals to a Joint Test Action Group (JTAG) interface in an integrated circuit package, the circuit comprising:
   a test reset (nTRST) pin configured to receive a test reset signal;
   a test mode select (TMS) pin configured to receive a test mode select signal;
   a testing test access port (TAP) having a test reset signal input and a test mode select signal input;
   a debugging test access port (TAP) having a test reset signal input coupled to the nTRST pin and a test mode select signal input coupled to the TMS pin;
   an inverter having an input coupled to the nTRST pin and an output coupled to the test reset signal input of the testing TAP; and
   an AND gate having a first input coupled to the output of the inverter, a second input coupled to the TMS pin, and an output coupled to the test mode select input of the testing TAP.

2. The circuit of claim 1, wherein the testing TAP is selected and the debugging TAP is placed in a reset mode when the test reset signal is asserted and the testing TAP operations are controlled from the test mode select signal.

3. The circuit of claim 1, wherein the debugging TAP is selected and the testing TAP is placed in a reset mode when the test reset signal is deasserted and the debugging TAP operations are controlled from the test mode select signal.

4. The circuit of claim 1, wherein the circuit lacks a TAPSEL pin receiving a TAP selection signal.

5. The circuit of claim 1, wherein the circuit lacks a TAPSEL pin receiving a TAP selection signal, and further includes a general purpose input output pin.

6. The circuit of claim 1, wherein the JTAG interface consists of an interface compliant with IEEE Standard 1149.1-2013, entitled Standard Test Access Port and Boundary-Scan Architecture; wherein the test reset signal consists of a nTRST signal according to the IEEE Standard 1149.1-2013; wherein the test mode select signal consists of a TMS signal according to the IEEE Standard 1149.1-2013; wherein the testing TAP consists of a testing TAP according to IEEE Standard 1149.1-2013; and wherein the debugging TAP consists of a debugging tap according to IEEE Standard 1149.1-2013.

7. A method of coupling test access port (TAP) signals to a Joint Test Action Group (JTAG) interface in an integrated circuit package without use of a tap selection signal, the method comprising:
   when a test reset signal is asserted:
      selecting a testing test access port (TAP);
      placing a debugging test access port (TAP) in a reset mode; and
      controlling the testing test access port (TAP) operations from the test mode select signal as a function of a logical complement operation performed on the test reset signal and a logical AND operation performed on the test mode select signal and output of the logic complement operation;
   when a test reset signal is deasserted:
      placing the testing TAP into the reset mode; and
      selecting the debugging TAP and controlling the debugging test access port (TAP) operations from the test mode select signal.

8. The method of claim 7, further comprising not receiving the TAP selection signal at a TAPSEL pin.

9. The method of claim 7, further comprising providing the integrated circuit package with a general purpose input output pin that does not receive the TAP selection signal, and not providing the integrated circuit package with a TAPSEL pin.

10. The method of claim 7, wherein the JTAG interface consists of an interface meeting IEEE Standard 1149.1-2013, entitled Standard Test Access Port and Boundary-Scan Architecture; wherein the test reset signal consists of a nTRST signal according to the IEEE Standard 1149.1-2013; wherein the test mode select signal consists of a TMS signal according to the IEEE Standard 1149.1-2013; wherein the testing TAP consists of a testing TAP according to IEEE Standard 1149.1-2013; and wherein the debugging TAP consists of a debugging tap according to IEEE Standard 1149.1-2013.

* * * * *